United States Patent [19]
Assadi et al.

[11] Patent Number: 6,166,369
[45] Date of Patent: Dec. 26, 2000

[54] MICROCOLLECTOR FOR PHOTOSENSITIVE DEVICES USING SOL-GEL

[75] Inventors: Azar Assadi, Tempe; Kannan Raj, Chandler, both of Ariz.

[73] Assignee: Intel Corporation, Santa Clara, Calif.

[21] Appl. No.: 09/200,517

[22] Filed: Nov. 25, 1998

[51] Int. Cl.$^7$ .................................................. H01L 27/00
[52] U.S. Cl. .................................... 250/214.1; 250/208.1; 257/416
[58] Field of Search ............................ 250/208.1, 208.2, 250/214 R, 214.1, 216; 257/292, 294, 434–436, 415–416

[56] References Cited

U.S. PATENT DOCUMENTS

| | | | |
|---|---|---|---|
| 5,204,520 | 4/1993 | Green | 250/214.1 |
| 5,798,557 | 8/1998 | Salatino et al. | 257/416 |
| 5,952,645 | 9/1999 | Wang et al. | 250/208.1 |

FOREIGN PATENT DOCUMENTS

| | | |
|---|---|---|
| 8702109 | 4/1989 | Netherlands . |
| WO 98/09336 | 3/1998 | WIPO . |

OTHER PUBLICATIONS

European Patent Office, Solid Image Pick–Up Element, Dec. 26, 1984, 1 Page.
P. Coudray, et al., Ultraviolet Light Imprinted Sol–Gel Silica Glass Waveguide Devices on Silicon, Jul. 1, 1996, 4 Pages.
D.R. Uhlmann, et al., "Sol–gel derived coatings on glass", Journal of Non–Crystalline Solids (1997); pp. 113–119.
C.–Y. Li, et al., "Sol–gel integrated optical coupler by ultraviolet light imprinting", IEEE 1995.
Mark P. Andrews, "An Overview of Sol–gel Guest–Host Materials Chemistry for Optical Devices", SPIE vol. 2997; pp. 48–59.

*Primary Examiner*—Stephone B. Allen
*Attorney, Agent, or Firm*—Trop, Pruner & Hu, P.C.

[57] ABSTRACT

A microcollector for photosensitive devices such as imaging arrays for digital cameras, scanners and other devices, may be formed on a semiconductor structure adjacent to a photosensitive element. The collector may include reflective surfaces arranged about the photosensitive element so as to reflect incident light towards the photosensitive element. The collector may be used in conjunction with a refractive/diffractive microlens to further focus light onto the photosensitive element. As a result, the fill factor of the photosensitive device may be improved, and the signal to noise ratio may also be enhanced.

21 Claims, 3 Drawing Sheets

MICROCOLLECTOR FOR PHOTOSENSITIVE DEVICES USING SOL-GEL

BACKGROUND

This invention relates generally to microelectronic photosensitive devices which may be used to convert incident radiation into an electric signal representative of the intensity of that radiation. Such devices may be used to form the imaging array of digital imaging devices such as a digital camera, and other devices.

Photosensitive devices may be formed using integrated circuit technology to create an array of photosensitive detectors. This array produces signals representative of the incident radiation. These signals may be digitized to form a digital representation of the target image. By using microelectronic technology to form an array of sensors, a detecting array of relatively small size may be created. Each of the detectors use relatively little power and may be relatively sensitive to incident radiation.

In some embodiments complementary metal oxide semiconductor (CMOS) technology may be used to form imaging arrays. These arrays may be formed of active pixel sensors (APS) or passive pixel sensors (PPS). In addition charge coupled device (CCD) technology may be used to form imaging arrays.

As the photosensitive devices become smaller in size, the fill factor of these devices, which is the amount of light which they collect, correspondingly decreases absent other corrective measures. Thus, in some embodiments, microlenses may be used to collect light from an area larger than the particular photodetector and focus that incident light on the detector. Generally, the microlens diffracts the incoming light and therefore may adversely affect the light which impacts the photosensitive device.

Therefore, there is a continuing need for improved ways to collect incident light and to focus the greatest possible amount of that light on the photodetectors which form an imaging array.

SUMMARY

In accordance with one embodiment, a microelectronic photosensitive device includes a semiconductor structure. A photosensitive element is formed on the structure. A reflective surface is formed on the structure so as to reflect incident light towards the photosensitive element.

DETAILED DESCRIPTION

Figure 1:
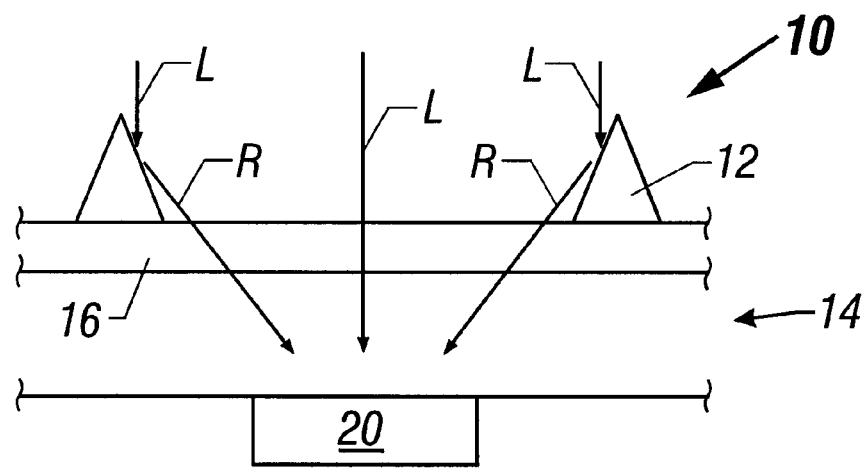
FIG. 1 is an enlarged, partial, cross-sectional view of one embodiment of the present invention.

A microelectronic photosensitive device 10, shown in FIG. 1, may be manufactured using conventional semiconductor manufacturing technology. The device 10 may, for example, be a CMOS integrated circuit element or a CCD device. The device 10 may be formed on semiconductor structure 14 including a color filter array 16, a silicon dioxide layer 18, and a photosensitive device 20. Formed on top of the semiconductor structure 14 may be a pattern of reflective surfaces 12 which are illustrated as being triangular or wedge shaped.

The reflective surfaces 12 are arranged to reflect incident light "L" as indicated by the arrow "R" towards the photosensitive device 20. By arranging a reflective surface on at least one side of the photosensitive device 20, incident light, which would otherwise not make its way to the photosensitive device, may be reflected so as to be received by the photosensitive device 20, increasing its fill factor.

The precise angle of the reflective surfaces 12 may be determined to maximize the reflective characteristics in accordance with a particular arrangement of the photosensitive device with respect to the reflective surfaces 12. However, in general it may be advantageous that the aspect ratio of the reflective surfaces 12 be about 2 to 1. In this way, the reflective surface 12 does not need to adversely affect the photo response non-uniformity (PRNU) of the photosensitive device.

Figure 2:
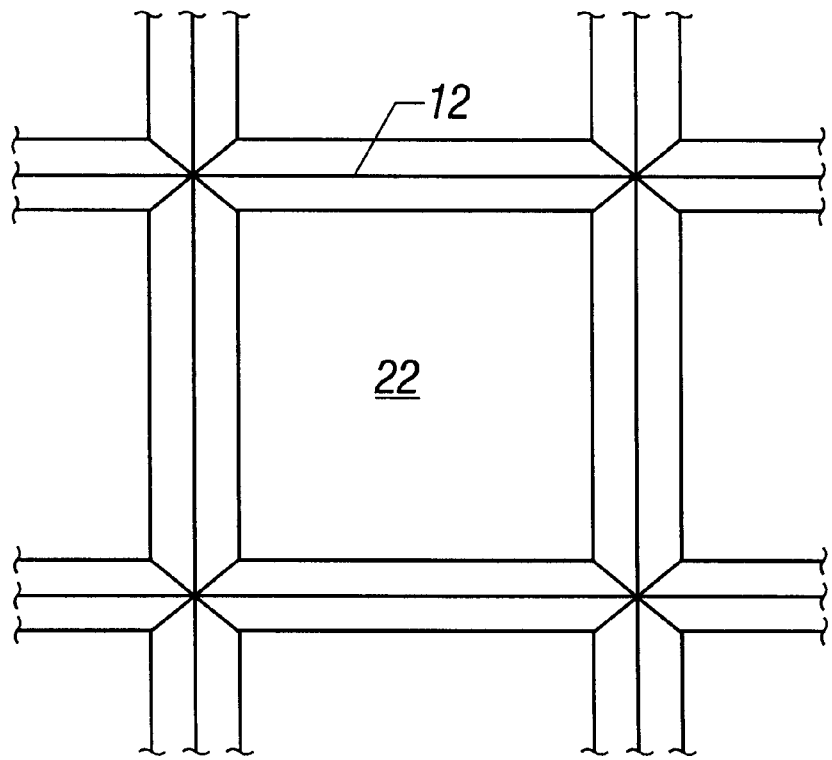
FIG. 2 is a partial, enlarged, top plan view of the embodiment shown in FIG. 1.

Referring to FIG. 2, the reflective surfaces 12 may be arranged in a pattern of wedge-shaped rows and columns which totally surround an active area 22 including the photosensitive device 20. In this way, active areas 22 may be defined for each photosensitive device. While an orthogonal pattern of reflective surfaces 12 is illustrated in FIG. 2, the reflective surfaces 12 could also be curved so that a relatively circular arrangement may be provided around each photosensitive device 20.

Figure 6:
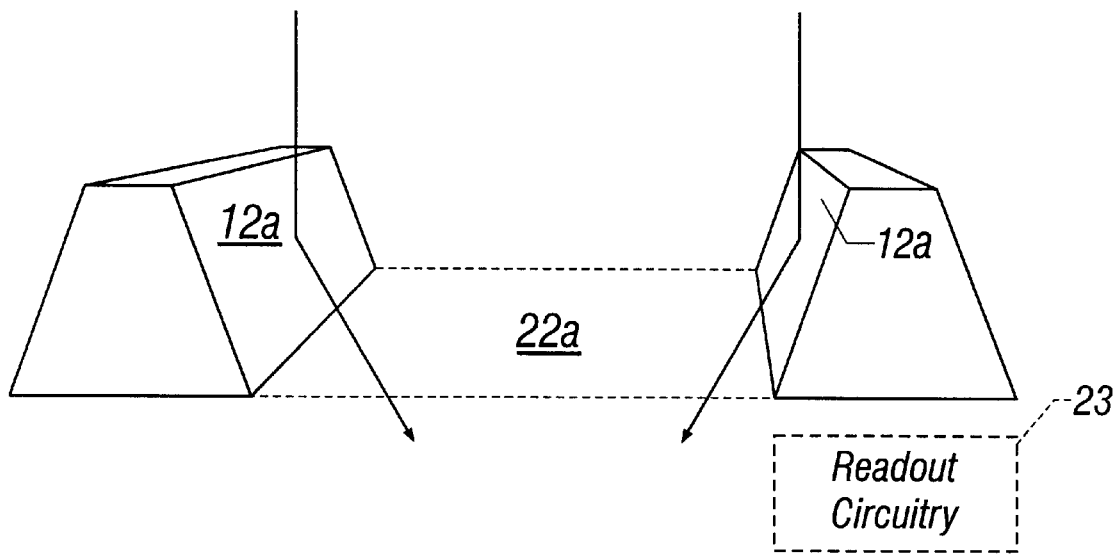
FIG. 6 is a partial perspective view of another embodiment.

Alternatively, one or more discrete reflective surfaces 12a may be arranged adjacent to active areas 22a, as shown in FIG. 6. The surfaces 12a may be arranged to overlie non-photosensitive portions of the semiconductor structure 14. For example, these non-photosensitive areas may include the readout circuitry 23 for the array of photosensitive devices.

Figure 3:
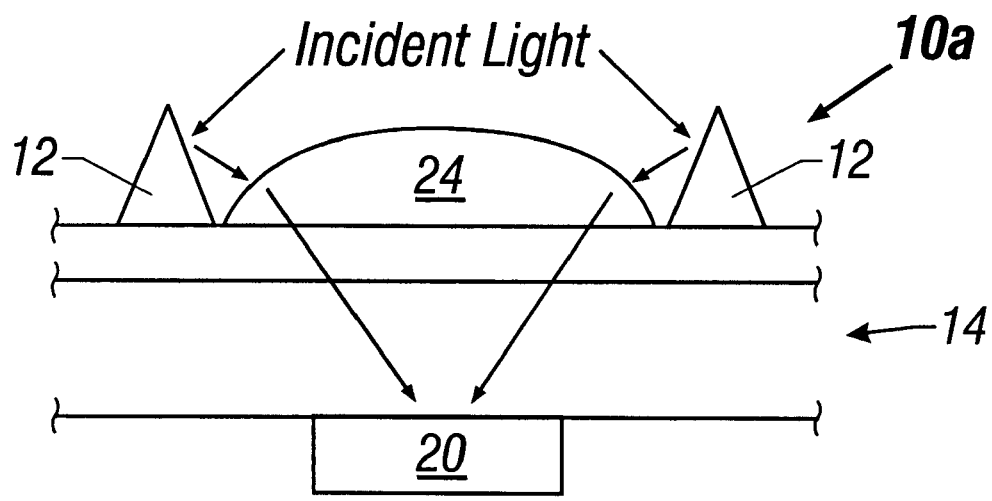
FIG. 3 is a partial, enlarged side elevational view of another embodiment in accordance with the present invention.

Moving now to FIG. 3, an embodiment similar to that shown in FIG. 1 is illustrated including reflective surfaces 12 over a semiconductor structure 14 and a photosensitive device 20. However, in FIG. 3, a microlens 24 has been formed over the semiconductor structure 14. As a result, light reflected from the reflective surfaces 12 may then be diffracted by the microlens 24, as illustrated, towards the photosensitive device 20. In this way, the reflective surfaces 12 and the microlens 24 work together to improve the fill factor of the photosensitive device 20. As pixel sizes become smaller the reflective micro-structure becomes more effective in increasing the light collection efficiency.

Advantageously, the reflective surfaces 12 may be formed by a hybrid sol-gel glass. The hybrid sol-gel glass can be formed using low temperature formation processes. Thus, the glasses may be shaped and formed using techniques comparable to that utilized in connection with forming photoresists. That is, UV light may be used to expose a portion of the sol-gel material and to develop that material so that the remaining portion may be removed.

Sol-gel glasses may be formed, for example, by hydrolysis of tetraethylorthosilicate (TEOS) and/or tetramethylorthosilicate (TMOS). After hydrolysis, these materials are subjected to oxolation or oxygen bridge formation in polycondensation. The result is a silicon oxide complex which is solvent swollen to form a polymerized network. If a photoinitiator is included in the complex, the material may be shaped using conventional photoresist patterning techniques.

In accordance with one embodiment, a sol-gel hybrid glass can be prepared by hydrolysis polycondensation of the methacrylate group substituted silane in the presence of water. The gel synthesis happens, allowing the methylacryloxypropyl trimethoxysilane or glysidoxypropyltrimethlylsilane precursor material to react with diluted acid or base water solution, for example, in a molar ratio of 1:2 respectively for several hours.

Before spin coating, propriety amounts of 1-hydroxycyclohexyl phenyl ketone may be added as a photoinitiator to initiate polymerization of unsaturated glass hybrid polymer.

The gel may be filtered by an 0.1 millimeter filter to remove aggregated polymer particles and to form a film with good surface quality. Films may then be then deposited on top of previously fabricated color filter polymer used to form the CFA or on other substrates and pre-baked at 60° C. for 15 minutes. The resulting film thickness is adjustable by varying spinning speed and use of solvents such as methanol, ethanol or xylene.

Figure 4:
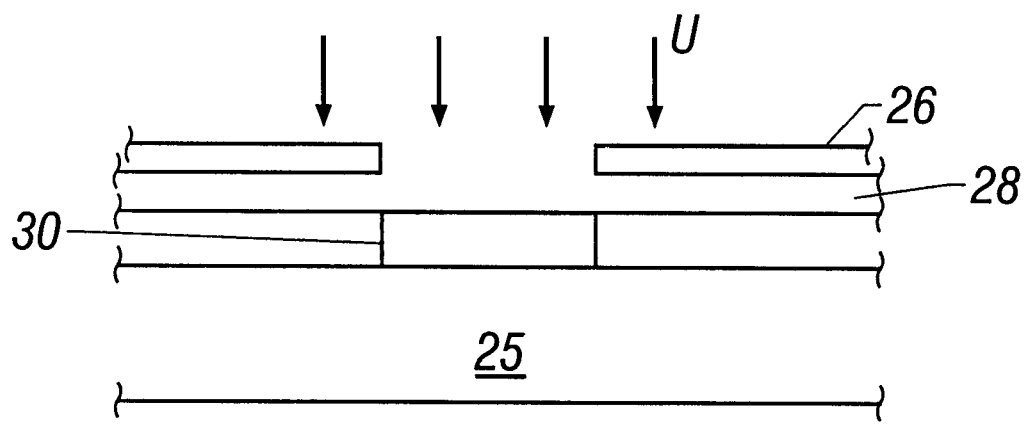
FIG. 4 is an enlarged, partial, side elevational view showing one step in the process of forming the devices shown in the preceding figures.
Figure 5:
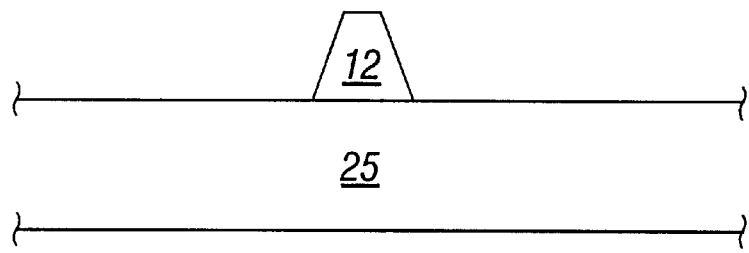
FIG. 5 is a partial, enlarged, side elevational view of a device made as a result of the arrangement shown in FIG. 4.

Referring now to FIG. 4, the reflective surfaces 12 may be formed using a photolithographic-type technique. A quartz or glass mask 26 may be formed with a transmissive region to pass ultraviolet light indicated by the letter "U" in FIG. 4. The light exposes a region 30 in the underlying sol-gel layer 28. The layer 28 is positioned over the semiconductor structure 25. By overexposing the region 30 to ultraviolet light, the triangular shape shown in FIG. 5 may result. The patterned glass is obtained by developing the sol-gel in isopropanol to remove unexposed parts of the sol-gel. This may form the blunt topped reflective surface 12 shown in FIG. 5. After patterning the sol-gel may be postbaked at 100° C. to 200° C. for 10 to 60 minutes to harden the glass.

Alternatively, the wedge shape may be formed using unfocussed photolithography. By varying the spacing between the mask, the optics, and the exposed surface, the mask pattern may be formed in an unfocused state on the exposed surface. This may produce a triangular cross-sectional shape.

If particular material properties are necessary, titanium, silicon or zirconium, or the prehydrolysed alkoksides of these materials can be added to the solution of the methacrylate group substituted silanes. For example, titanium (IV)-propoxide and zirconium(IV)-propoxide may be used. Methacrylic acid may be used to prevent zirconium propoxide precipitation.

In order to make the sol-gel hybrid glass reflective, silver nitrate may be added to the sol-gel solution to make the resulting material reflective. Alternatively, sol-gel materials may be coated with silver nitrate.

In some embodiments using reflective surfaces and microlenses, it may be desirable to form the microlenses first, for example using conventional microlens material. Conventional microlenses may be formed by depositing a suitable material at 90° C. for thirty seconds, and postbaking and reflow at 140° C. for ninety seconds, as examples. Then the surfaces 12 may be formed without being exposed to the same thermal budget used for forming microlenses.

The regions underneath the wedge-shaped reflective surfaces 12 may include non-light sensitive circuitry such as read-out circuitry for the array. Light falling on these regions, which would otherwise be unused, may be collected by the reflective surfaces 12. This may improve the amount of available light, increasing the fill factor, and enabling photosensitive devices to be used under low lighting conditions such as indoor lighting. By increasing the fill factor, the signal noise ratio may be increased. In some cases, the reflective surfaces 12 act as an effective light shield for underlying circuitry whose performance might otherwise be adversely affected by light exposure. In addition, the reflective surfaces 12, because of their aspect ratios, may provide advantageous heat dissipation. By making the reflective surfaces 12 of hybrid sol-gel glass, they may be formed by using standard semiconductor lithographic techniques.

While the present invention has been described with respect to a limited number of embodiments, those skilled in the art will appreciate numerous modifications and variations therefrom. For example, instead of using sol-gel technology, the reflective surfaces could be made using other materials. It is intended that the appended claims cover all such modifications and variations which fall within the true spirit and scope of the present invention.

What is claimed is:

1. A microelectronic photosensitive device comprising:
   a semiconductor structure;
   a photosensitive element formed on said structure; and
   a reflective sol-gel surface formed on such structure so as to reflect incident light towards the element.

2. The device of claim 1 wherein said reflective surface is part of a wedge-shaped reflector.

3. The device of claim 1 wherein said sol-gel includes silver nitrate.

4. The device of claim 1 further including two adjacent reflective surfaces and a microlens situated between two adjacent reflective surfaces.

5. The device of claim 1 wherein said sol-gel includes a photoinitiator.

6. The device of claim 1 including two adjacent photosensitive elements, wherein said reflective surfaces are formed on a wedge-shaped element, said wedge-shaped element being positioned between said two adjacent photosensitive elements.

7. The device of claim 1 wherein said reflective surface has an aspect ratio of about 2:1.

8. The device of claim 1 wherein a pair of reflective surfaces are provided around at least two sides of said photosensitive element.

9. The device of claim 8 wherein said reflective surfaces are provided around four sides of said photosensitive element.

10. A method of forming photosensitive devices comprising:
    incorporating silver nitrate into a sol-gel material;
    depositing said sol-gel material on a semiconductor structure; and
    using photolithographic techniques to pattern said sol-gel material so as to form a reflective surface arranged to reflect light onto an adjacent photosensitive device.

11. The method of claim 10 wherein the step of using photolithographic techniques includes exposing said sol-gel material to light for sufficient time to overexpose said material to produce a triangular shape in the exposed material.

12. The method of claim 10 wherein the step of using photolithographic techniques includes exposing the sol-gel material to light, developing and differentially removing material based on light exposure.

13. A microelectronic photosensitive device comprising:
    a semiconductor structure;

a photosensitive element formed on said structure; and a wedge-shaped sol-gel reflective surface formed on said structure so as to reflect incident light towards said element.

14. The device of claim 13 wherein said wedge-shaped reflector has an aspect ratio of about 2:1.

15. The device of claim 13 wherein said glass includes silver nitrate.

16. The device of claim 13 including readout circuitry, said wedge-shaped reflector being formed over said readout circuitry.

17. The device of claim 13 wherein said hybrid sol-gel glass includes a photoinitiator.

18. The device of claim 17 wherein said wedge-shaped reflector extends completely around said photosensitive element.

19. A method comprising:

incorporating silver nitrate into a sol-gel material; and depositing said sol-gel material on a semiconductor structure so as to form a reflective surface.

20. The method of claim 19 including forming said reflective surface so as to reflect light towards a photosensitive element.

21. A microelectronic photosensitive device comprising:

a semiconductor structure;

a photosensitive element formed on said structure; and a surface formed on said structure, said surface formed of a sol-gel material having silver nitrate incorporated into said sol-gel material so as to reflect incident light towards said element.

* * * * *